United States Patent
Rumer et al.

(10) Patent No.: US 6,924,551 B2
(45) Date of Patent: Aug. 2, 2005

(54) THROUGH SILICON VIA, FOLDED FLEX MICROELECTRONIC PACKAGE

(75) Inventors: Christopher L. Rumer, Chandler, AZ (US); Edward A. Zarbock, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/447,493

(22) Filed: May 28, 2003

(65) Prior Publication Data

US 2004/0238936 A1 Dec. 2, 2004

(51) Int. Cl.[7] .......................... H01L 23/48; H01L 23/52; H01L 23/34; H01L 29/40
(52) U.S. Cl. ...................... 257/688; 257/691; 257/693; 257/723; 257/737
(58) Field of Search .................. 257/688, 691, 257/693, 723, 724, 725, 737, 780

(56) References Cited

U.S. PATENT DOCUMENTS

| | | | | |
|---|---|---|---|---|
| 5,646,446 A | * | 7/1997 | Nicewarner et al. | 257/723 |
| 6,028,365 A | * | 2/2000 | Akram et al. | 257/778 |
| 6,225,688 B1 | * | 5/2001 | Kim et al. | 257/686 |
| 6,329,712 B1 | * | 12/2001 | Akram et al. | 257/700 |
| 6,486,544 B1 | * | 11/2002 | Hashimoto | 257/686 |
| 6,576,992 B1 | * | 6/2003 | Cady et al. | 257/686 |
| 6,633,078 B2 | * | 10/2003 | Hamaguchi et al. | 257/686 |
| 2004/0021139 A1 | * | 2/2004 | Jackson et al. | 257/40 |

* cited by examiner

*Primary Examiner*—Nathan J. Flynn
*Assistant Examiner*—Victor A. Mandala, Jr.
(74) *Attorney, Agent, or Firm*—Robert G. Winkle

(57) ABSTRACT

A microelectronic package including a microelectronic die having through silicon vias extending through a back surface thereof, which allows both an active surface and the back surface of the microelectronic die to have power, ground, and/or input/output signals connected to a flexible substrate. The flexible substrate may further connected to an external substrate through at least one external contact.

23 Claims, 9 Drawing Sheets

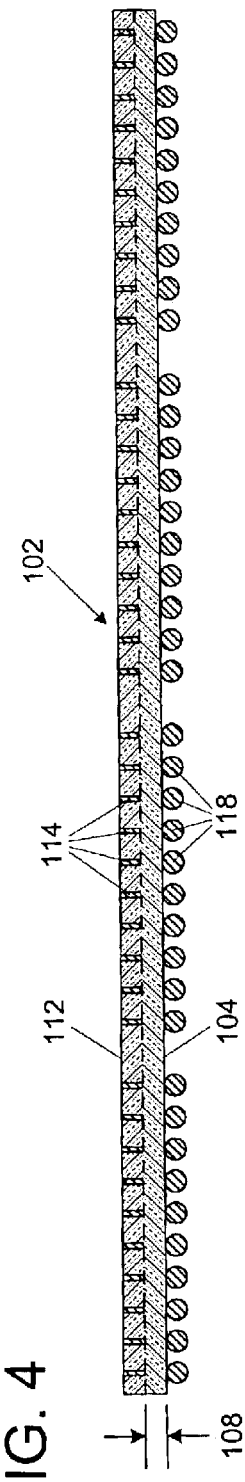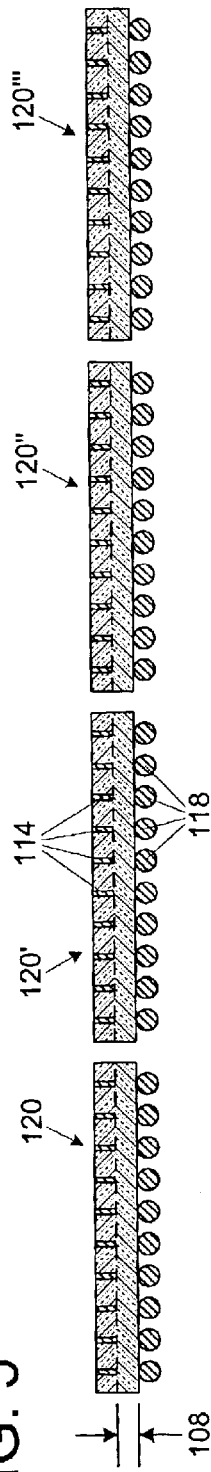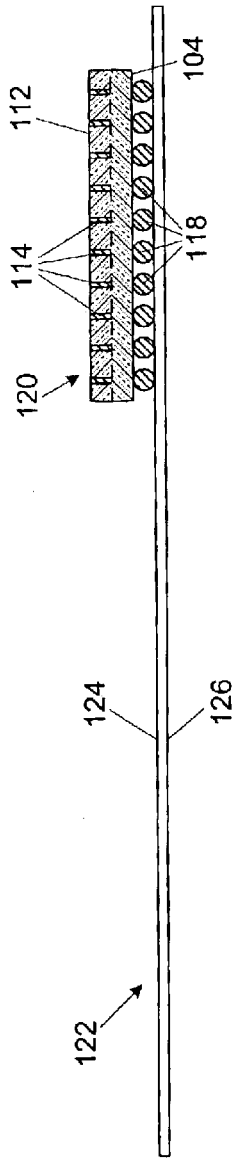
FIG. 4
FIG. 5
FIG. 6

THROUGH SILICON VIA, FOLDED FLEX MICROELECTRONIC PACKAGE

BACKGROUND OF THE INVENTION

1. Field of the Invention

The present invention relates to apparatus and methods for fabricating microelectronic packages. In particular, the present invention relates to microelectronic packages fabricated with a flex substrate and through silicon via technology.

2. State of the Art

Higher performance, reduced cost, increased miniaturization of integrated circuit components, and greater packaging densities of microelectronic devices are ongoing goals of the microelectronics industry. Moreover, small-sized, low-profile (thin) microelectronic packages are in high demand for use in small electronic devices, such as cell phones. Thus, the microelectronics industry fabricates a variety of small, thin packages.

FIG. 20 illustrates one such package known as a Wire Bonded Molded Matrix Array Package 200 (WB-MMAP). The WB-MMAP 200 comprises a microelectronic die 202 (such as a microprocessor, a chipset, a memory device, an ASIC, and the like) attached by its back surface 206 to a first surface 212 of a carrier substrate 208 (such as an interposer, a mother-board, a back surface of another microelectronic die, or the like). A plurality of bond wires 214 extend from bond pads (not shown) on an active surface 204 of the microelectronic die 202 to land pads (not shown) on the carrier substrate first surface 212 to make electrical contact therebetween, as will be understood by those skilled in the art. The carrier substrate 208 also includes a plurality of external contacts 218 attached to a second surface 216 thereof. These external contacts 218 connect the package to an external component (no shown), as will be understood to those skilled in the art. The microelectronic die 202 and bond wires 214 are encapsulated in a molding material 220 to prevent physical and chemical damage.

However, such packages are pad-limited, meaning that the microelectronic die 202 size (i.e., area) must be expanded (thereby wasting microelectronic die material) to allow sufficient bond pads to route signals to the carrier substrate 208. As bond wire 214 pitch is decreased to improve density, crosstalk issues between adjacent wires increase. Decreased bond wire 214 pitch may require the use of small diameter wires, which reduces current carrying capability, thereby increasing the need for more wires and defeating the purpose of tighter density.

Another known package, called a Flip Chip Molded Matrix Array Package (FC-MMAP), is illustrated in FIG. 21. The FC-MMAP 230 comprises a microelectronic die 232 (such as a microprocessor, a chipset, a memory device, an ASIC, and the like) attached by its active surface 234 to a first surface 236 of a carrier substrate 238 through a plurality of interconnects 242 (such as solder balls) extend from bond pads (not shown) on the microelectronic die active surface 234 to land pads (not shown) on the carrier substrate first surface 236 to make electrical contact therebetween, as will be understood by those skilled in the art. An underfill material 244 is dispersed between the microelectronic die active surface 234 and the carrier substrate first surface 236. The underfill material 244 provides mechanical support, contamination protection, and improves package reliability. The carrier substrate 238 also includes a plurality of external contacts 246 (such as solder balls) attached to a second surface 248 thereof. These external contacts 246 are used to connect the package to an external component (not shown), as will be understood to those skilled in the art. Unfortunately, such packages are also pad-limited, meaning that interconnect 242 pitch and/or routing limitations on the carrier substrate 238 prevent signal routing without increasing the size (i.e., area) of the microelectronic die 232.

A thin, stacked package configuration, known as a Folded Flex Ball Grid Array (FF-BGA), is illustrated in FIG. 22. A FF-BGA includes a flexible substrate to route electrical traces from the second microelectronic die to a position between the first microelectronic die and the carrier substrate to make electrical contact therewith. FIG. 22 shows an FF-BGA package 250, wherein a first microelectronic die 252 and a second microelectronic die 254 are attached to and in electrical contact with a first surface 258 of a flexible substrate 256 through wire bonds 262 and 264, respectively. The first microelectronic die 252 and second microelectronic die 254 may be fabricated in a manner discussed above with regard to the WB-MMAP 200 of FIG. 20. A first molding compound 266 and a second molding compound 268 is dispersed proximate each of the first and second microelectronic dice 252, 254, respectively.

The flexible substrate 256 includes conductive traces (not shown) disposed therein, thereon, and/or therethrough, which make contact with an array 274 of external interconnects 276 (such as solder balls) disposed on a second surface 272 of the flexible substrate 256 proximate the first microelectronic die 252. Thus, both the first microelectronic die 252 and the second microelectronic die 254 have external interconnects 276 within the array 274. The flexible substrate 256 is bent such that a back surface 282 of the first molding compound 266 can be attached to a back surface 284 of the second molding compound 268 with a layer of adhesive 286. The external interconnects 276 are attached to a substrate 288 using a standard solder ball attachment process, as will be understood to those skilled in the art.

Although such approaches result in serviceable microelectronic packages, it would be advantageous to fabricate microelectronic packages, which have increased signal routing without requiring an increase in the size of the microelectronic die.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

FIG. 4 is a side cross-sectional view of the microelectronic wafer of FIG. 3 having a plurality of interconnects attached to the microelectronic wafer active surface conductive, according to the present invention;

FIG. 5 is a side cross-sectional view of the microelectronic wafer of FIG. 4 having been singulated into a plurality of individual microelectronic dice, according to the present invention;

FIG. 6 is a side cross-sectional view of a singulated microelectronic die of FIG. 5 mounted on a flexible substrate, according to the present invention;

DETAILED DESCRIPTION OF THE ILLUSTRATED EMBODIMENT

Figure 1:
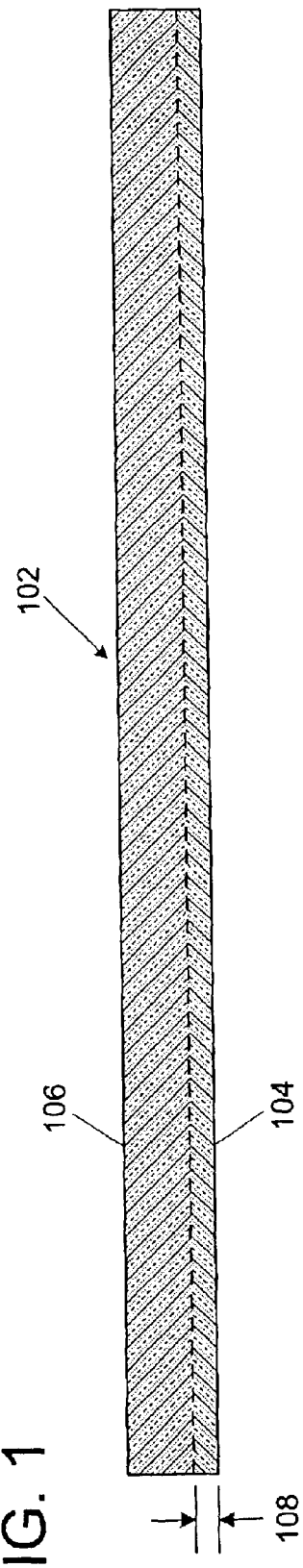
FIG. 1 is a side cross-sectional view of a microelectronic wafer having an active surface with circuitry formed therein and thereon, according to the present invention.
Figure 2:
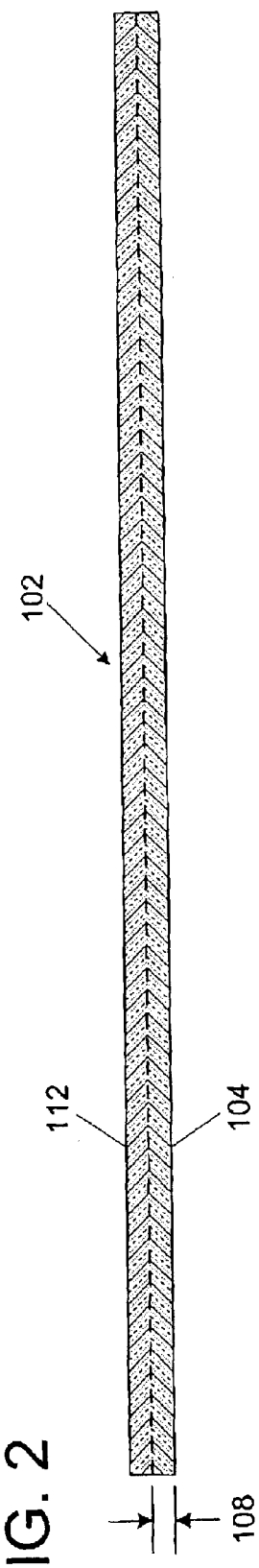
FIG. 2 is a side cross-sectional view of the microelectronic wafer of FIG. 1 after a back grinding operation, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to a microelectronic package including a microelectronic die having through silicon vias extending through a back surface thereof, which allows both the active surface and the back surface of the microelectronic die to have power, ground, and/or input/output signals connected to a flexible substrate. Such a configuration enables the power, ground, and/or input/output signal connections to be isolated and allows higher signal connection density than standard wirebond or flip chip package technologies, which improves silicon utilization, and may enhance microelectronic die performance. Furthermore, such a configuration can eliminate the pad-limitation issues, discussed above, and allow power and/or ground to be delivered to central areas of the microelectronic die without using traces from the perimeter of the microelectronic die to the center thereof.

FIGS. 1–17 illustrate a method of fabricating a through silicon via, folded flex microelectronic device, according to the present invention. FIG. 1 illustrates a microelectronic wafer 102 having an active surface 104 and a back surface 106 (opposing said active surface 104). The microelectronic wafer active surface 104 includes integrated circuitry components (illustrated generically as an integrated circuitry layer 108 within the illustrated dash line and the microelectronic wafer active surface 104), which are formed in the microelectronic wafer 102, usually less than about 10 microns deep from the microelectronic wafer active surface 104 into and/or on the microelectronic wafer 102. This microelectronic wafer integrated circuitry layer 108 is the functional area of the microelectronic wafer 102. As will be understood by those skilled in the art, the microelectronic wafer 102 may be between about 700 and 800 microns thick and may include any substrate capable of having integrated circuitry formed therein and/or thereon, including but not limited to, silicon, silicon-on-insulator, germanium, indium antimonide, lead telluride, indium arsenide, indium phosphide, gallium arsenide, or gallium antimonide. It is, of course, understood that the integrated circuitry of the microelectronic wafer integrated circuitry layer 108 may be any circuitry, including but not limited to, circuitry used in central processing units (CPUs), chipsets, memory devices, ASICs, and the like. It is also understood, the microelectronic wafer integrated circuitry layer 108 may include an interconnect layer not shown comprising multiple conductive traces to provide routes for electrical communication between integrated circuit components within the integrated circuits and between integrated circuit components and external devices (not shown).

Although the 700 to 800 micron thickness of the microelectronic wafer 102 is generally required for the fabrication of the microelectronic wafer integrated circuit layer 108, only the microelectronic wafer integrated circuitry layer 108 is functional. Thus, after the fabrication of the microelectronic wafer integrated circuit layer 108, a substantial amount of the microelectronic wafer 102 may be removed (i.e., "thinned") without affecting the microelectronic wafer integrated circuitry layer 108. Thinning a micro-electronic wafer makes it possible to route input-output signals, power, and ground to and from the integrated circuitry layer to the back surface of the microelectronic wafer, as will be discussed. The thinning of the microelectronic wafer 102 may be carried out by any process known in the art, including but not limited to grinding, spin etching, and/or chemical mechanical polishing to form a thinned back side 112 of the microelectronic wafer 102.

Figure 3:
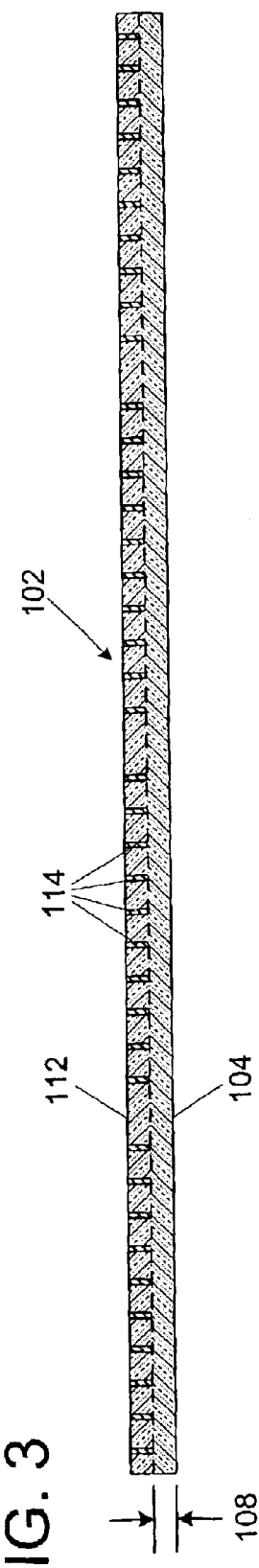
FIG. 3 is a side cross-sectional view of the microelectronic wafer of FIG. 2 having conductive through silicon vias extending from a back surface of the microelectronic wafer to the circuitry, according to the present invention.

A plurality of conductive vias 114 (through silicon vias) are then formed to extend from the microelectronic wafer thinned back surface 112 to the microelectronic wafer integrated circuitry layer 108 to make electrical connections therewith, as shown in FIG. 3, by any known technique, including but not limited to a deep reaction ion etch process followed by a plating technique to fill opening formed with the etch process. As shown in FIG. 4, a plurality of first interconnect devices 118, such as solder balls or metal-filled polymers, are then formed (such as by a plating or screen printing process, as known in the art) on bond pads (not shown) on the microelectronic die active surface 104 to make electrical contact with the microelectronic wafer integrated circuitry layer 108, as will understood by those skilled in the art. The microelectronic wafer 102 may then be diced or singulated, such as with a wafer saw or a laser (not shown) to form a discrete microelectronic dice 120, 120', 120", and 120'", as shown in FIG. 5.

A singulated microelectronic die 120 is then mounted on a first surface 124 of a flexible substrate 122, as shown in FIG. 6. The microelectronic die 102 is attached with the first interconnect devices 118 (such as conventional flip chip soldered interconnects) to at least one active surface attachment pad 144 (see FIG. 7), such as by a reflow process known in the art. The flexible substrate 122 is preferable a polymeric material, such as polyimide tape or other such flex tape, as known in the art.

Figure 7:
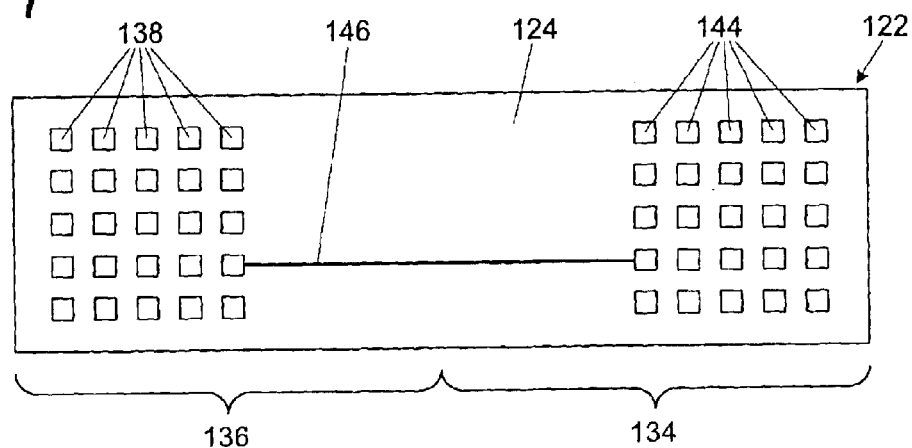
FIGS. 7–9 are plan views and a side cross-sectional view of the flexible substrate of FIG. 6, according to the present invention.
Figure 8:
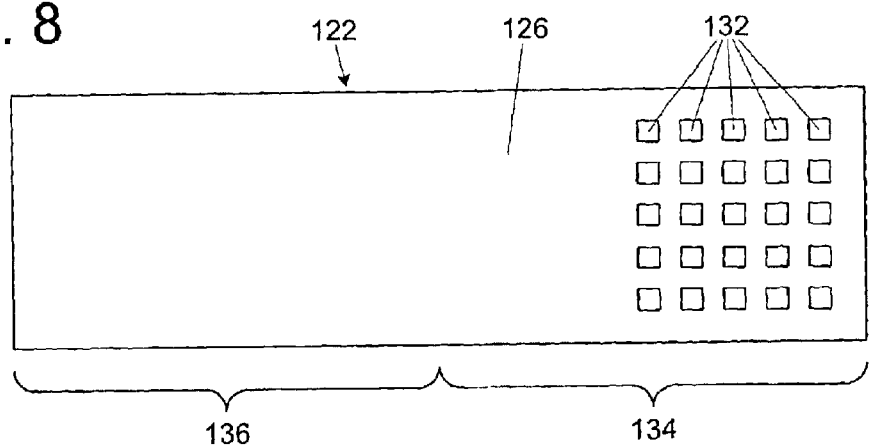
Figure 9:
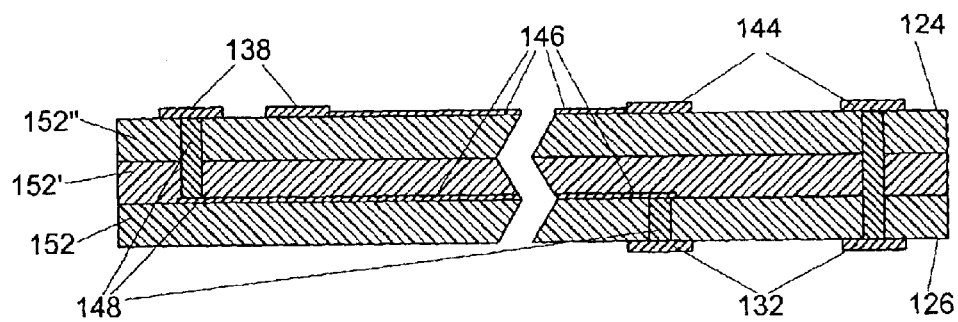

FIG. 7 illustrates the flexible substrate first surface 124 having at least one active surface attachment pad 144 located in a microelectronic die active surface portion 134 of the flexible substrate 122 and having at least one back surface attachment pad 138 located in the microelectronic die back surface portion 136 of the flexible substrate 122. FIG. 8 illustrates a flexible substrate second surface 126 (opposing said flexible substrate first surface 124) having at least one external interconnect pad 132 located in the microelectronic die active surface portion 134 of the flexible substrate 122. As shown in FIG. 9, the flexible substrate 122 may be a plurality of layers (illustrated as elements 152, 152' and 152"), wherein conductive traces 146 may be integrated (i.e., disposed on, in, or through) with the flexible substrate layers 152, 152', and/or 152". Electrical connection through the flexible substrates layers 152, 152', and/or 152" is achieved with a plurality of flexible substrate conductive vias 148 extending therethrough. At least one electrical connection is made between at least one active surface attachment pad 144 and at least one external interconnect pad 132. At least one electrical connection is made between at least one back surface attachment pad 138 and at least one external interconnect pad 132. At least one conductive trace 146 may extend from at least one active surface attachment pad 144 to at least one back surface attachment pad 138. The conductive traces 146, the active surface attachment pads 144, the back surface attachment pads 138, the external interconnect pads 132, the flexible substrate conductive vias 148 are preferably metals, such as copper, aluminum, silver, gold, alloys thereof, and the like, but may also be formed from conductive polymers, such as copper-filled epoxies and the like.

Figure 10:
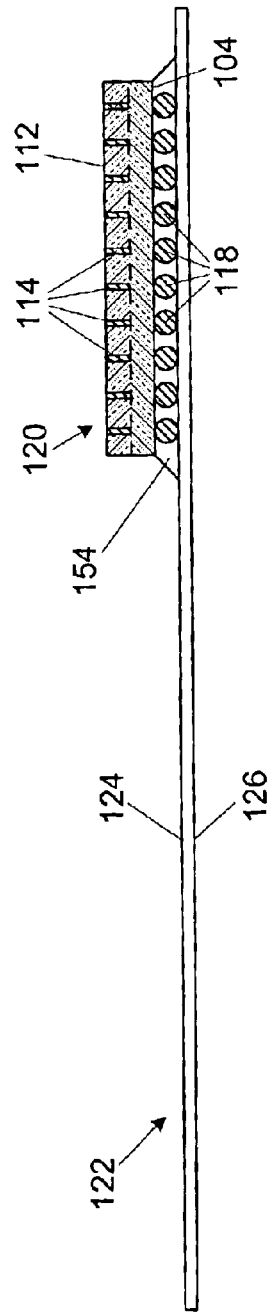
FIG. 10 is a side cross-sectional view of a singulated microelectronic die of FIG. 6 mounted on a flexible substrate having an underfill material disposed therebetween, according to the present invention.

After the microelectronic die 120 is mounted to the flexible substrate 102, a first underfill material 154, such as an epoxy material, may be dispersed between the microelectronic die active surface 104 and the flexible substrate first surface 124, as shown in FIG. 10. The first underfill material 154 provides mechanical support, contamination protection, and improves package reliability. It is, of course, understood that a no-flow underfill could be dispersed as the first underfill material 154 on the flexible substrate 102 prior to mounting the microelectronic die 120, as understood by those skilled in the art, rather than dispersing the first underfill material 154 after attachment.

Figure 11:
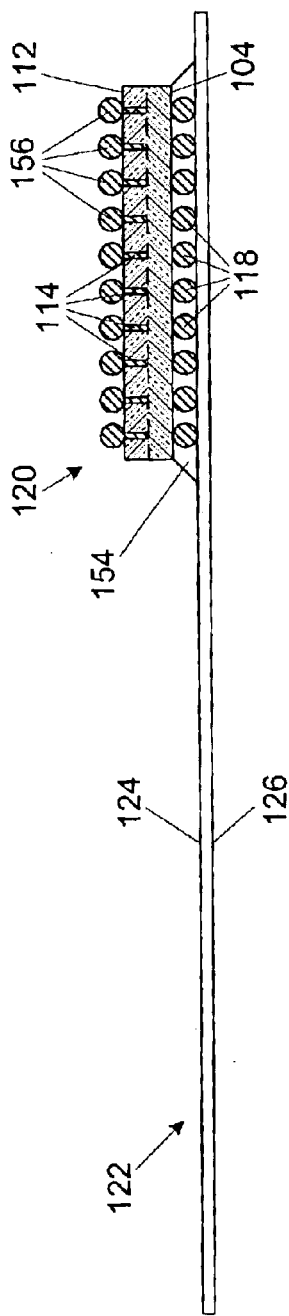
FIG. 11 is a side cross-sectional view of a singulated microelectronic die of FIG. 10 mounted on a flexible substrate having second interconnect devices with an underfill material disposed therebetween, according to the present invention.
Figure 12:
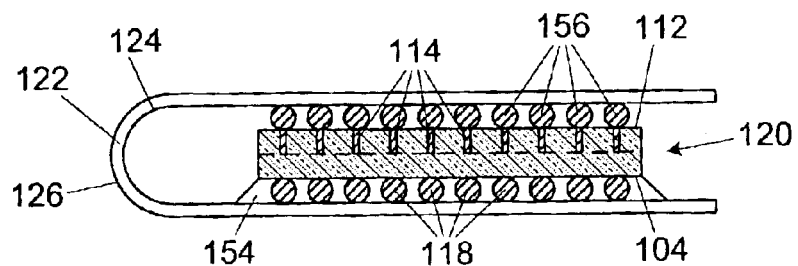
FIG. 12 is a side cross-sectional view of assembly of FIG. 11, wherein the flexible substrate have been folded and attached to the second interconnect devices, according to the present invention.
Figure 13:
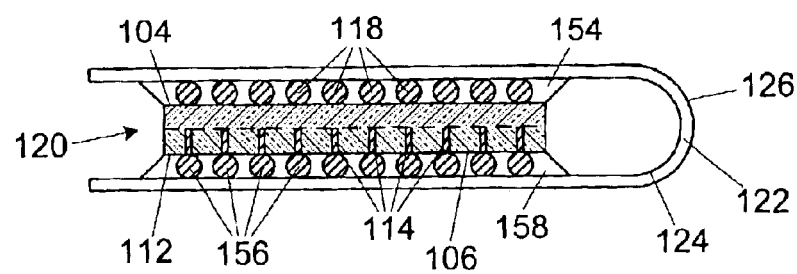
FIG. 13 is a side cross-sectional view of assembly of FIG. 12 that has been flipped and an underfill material disposed between a microelectronic die back surface and the flexible substrate first surface, according to the present invention.

A plurality of second interconnect devices 156, such as solder balls or metal-filled polymers, are then formed (such as by a plating or screen printing process, as known in the art) on the plurality of conductive vias 114 at the microelectronic wafer thinned back surface 134, as shown in FIG. 11. The flexible substrate 122 is then folded over, as shown in FIG. 12, and the plurality of second interconnect devices 156 are attached to the back surface attachment pads 138 (see FIG. 7), such as by a reflow process known in the art. The package is then flipped over, as shown in FIG. 13, and a second underfill material 158, such as an epoxy material, may be dispersed between the microelectronic die back surface 112. Again, it is understood that a no-flow underfill could be dispersed as the second underfill material 158 on the flexible substrate 102 prior to attaching the second interconnect device 156 to the flexible substrate 102, as understood by those skilled in the art, rather than dispersing the second underfill material 158 after attachment.

Figure 14:
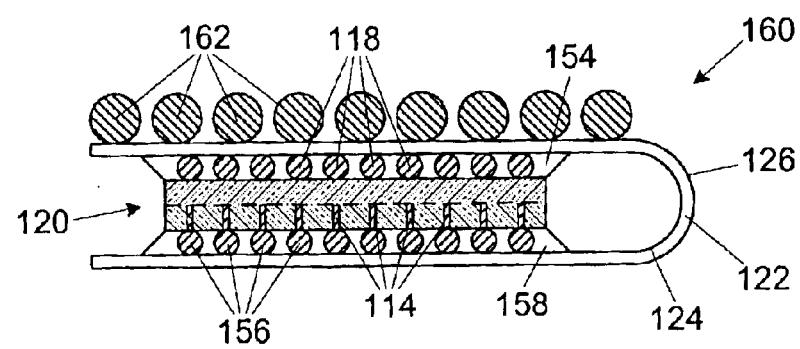
FIG. 14 is a side cross-sectional view of assembly of FIG. 13 wherein a plurality of external contact devices are attached to a flexible substrate second surface, according to the present invention.

As shown in FIG. 14, a plurality of external interconnect devices 162 are attached to the flexible substrate second surface 126 to the external interconnect pads 132 (see FIG. 8) to form a through silicon via, folded flex microelectronic package 160. The through silicon via, folded flex microelectronic package 160 is then flipped, as shown in FIG. 15, and may be electronically and physically attached to land pads (not shown) on a substrate 166 (such as an interposer, a motherboard, or the like) by the external interconnect devices 162, as shown in FIG. 16.

Figure 17:
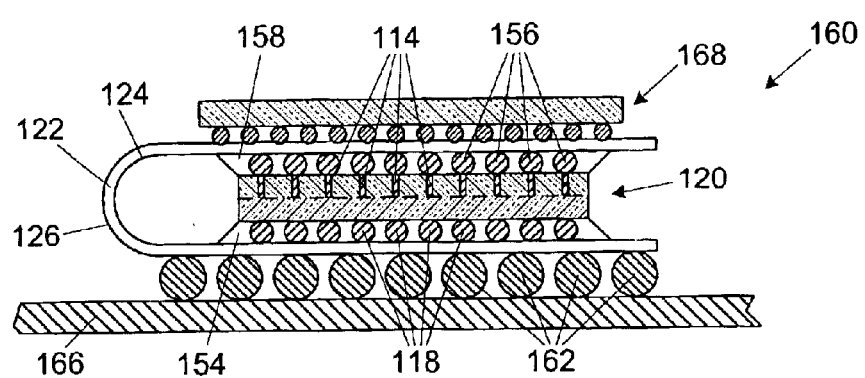
FIG. 17 is a side cross-sectional view of assembly of FIG. 116 which has an additional microelectronic is attached to a flexible substrate second surface, according to the present invention.

It is understood that the present invention may take many forms. For example, as shown in FIG. 17, at least one additional microelectronic die/device 168 may be attached to the flexible substrate second surface 126 proximate said microelectronic die back surface 106 in a stacked configuration, wherein appropriate electrical connections are incorporated into the flexible substrate 122. Furthermore, an alternate process flow option utilizing side gate transfer molding may be used in place of the underfill processes previously discussed. Moreover, the microelectronic die active surface may be underfilled and the microelectronic die backside may be molded. Additionally, the microelectronic die active surface and the microelectronic die backside may be simultaneously attached to the flexible substrate first surface, which can then be molded.

Figure 15:
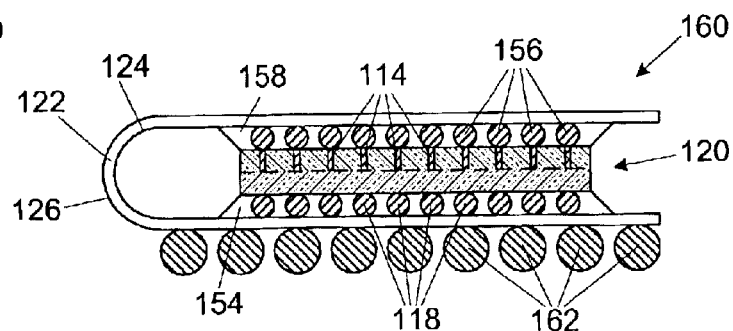
FIGS. 15 and 16 are side cross-sectional views of assembly of FIG. 14 that has been flipped and attached to a substrate by the external contact devices, according to the present invention.
Figure 16:
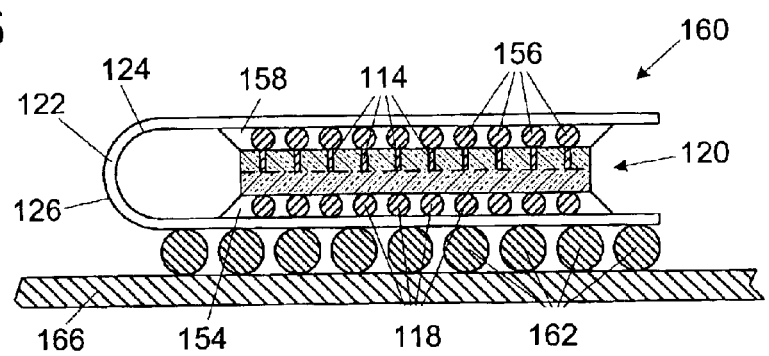
Figure 18:
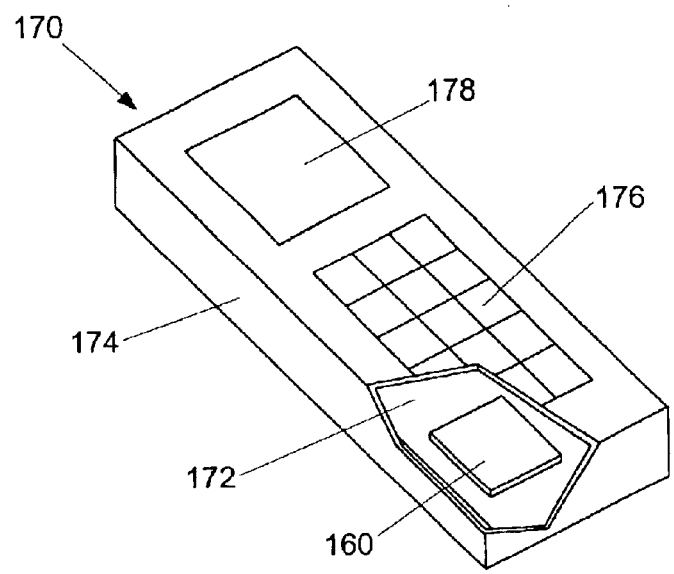
FIG. 18 is an oblique view of a hand-held system having a microelectronic assembly of the present integrated therein, according to the present invention.
Figure 19:
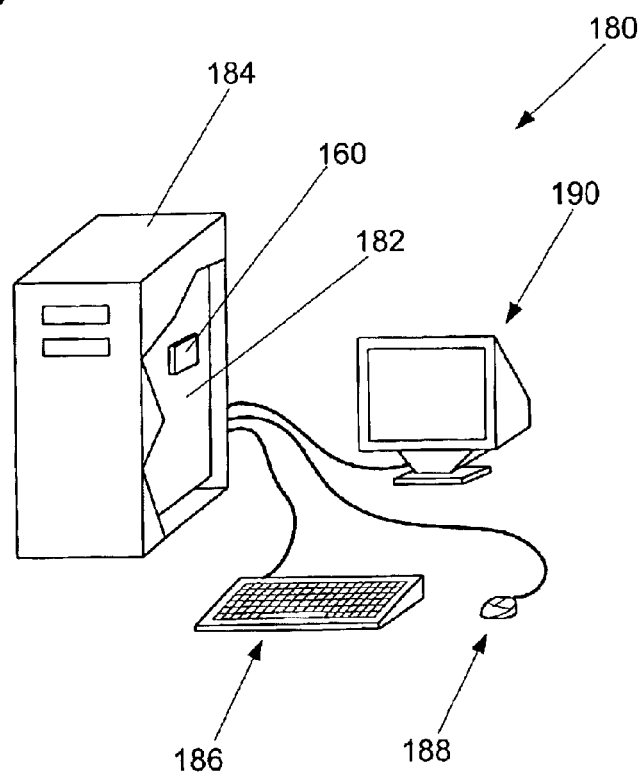
FIG. 19 is an oblique view of a computer system having a microelectronic assembly of the present integrated therein, according to the present invention.
Figure 20:
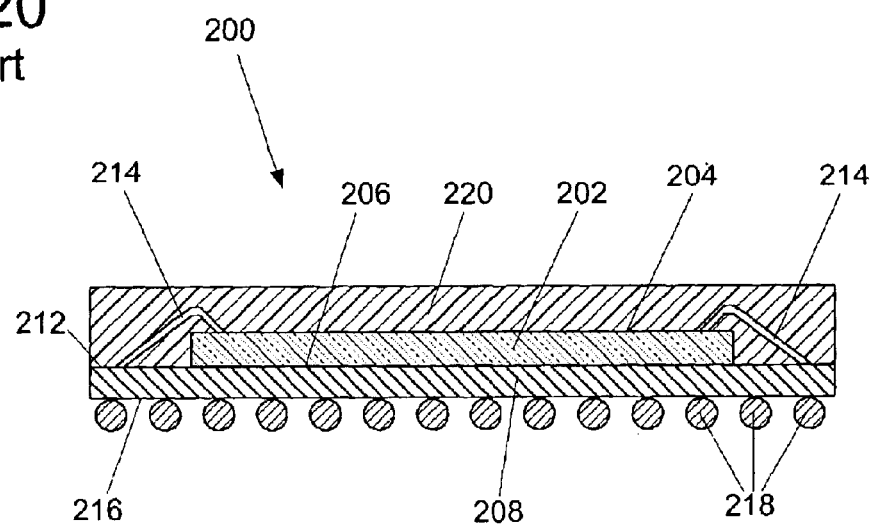
FIG. 20 is a side cross-sectional view of a wire bonded molded matrix array package, as known in the art.
Figure 21:
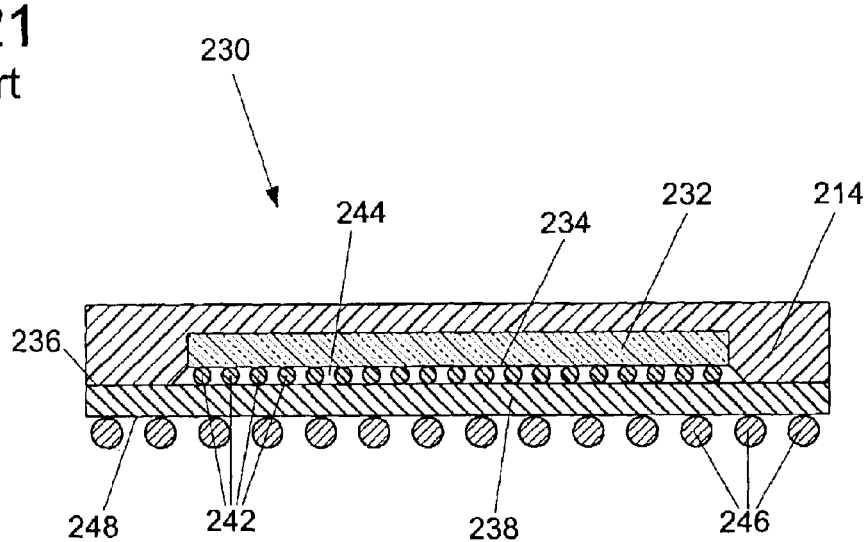
FIG. 21 is a side cross-sectional view of a flip-chip molded matrix array package, as known in the art.
Figure 22:
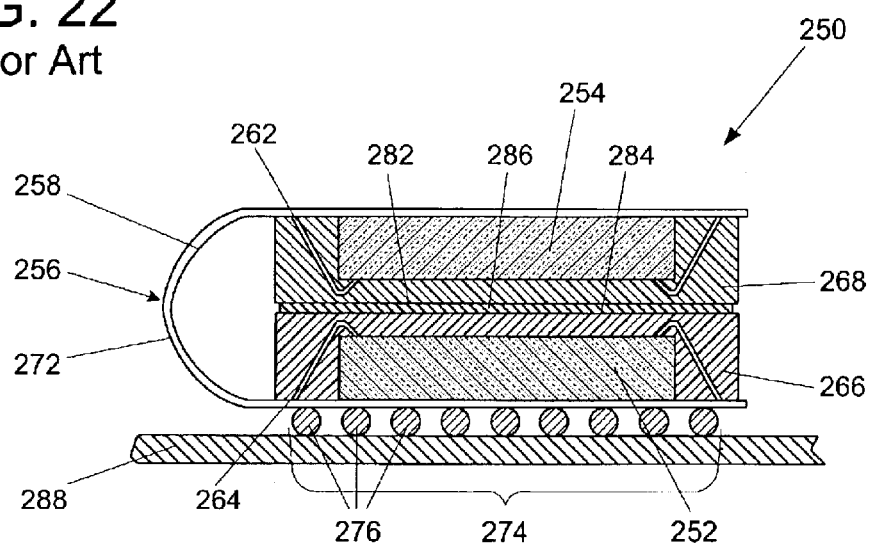
FIG. 22 is a side cross-sectional view of a folded flex ball grid array package, as known in the art.

The packages formed by the present invention, such as the through silicon via, folded flex microelectronic package 160 of FIG. 15, may be used in a hand-held device 170, such as a cell phone or a personal data assistant (PDA), as shown in FIG. 18. The hand-held device 170 may comprise a substrate 172, with the through silicon via, folded flex microelectronic package 160 attached thereto, within a housing 174. The substrate 172 may be attached to various peripheral devices including an input device, such as keypad 176, and a display device, such an LCD display 178.

The microelectronic device assemblies formed by the present invention, such as microelectronic device assembly 100 of FIG. 1, may also be used in a computer system 180, as shown in FIG. 7. The computer system 180 may comprise a motherboard 182 with the through silicon via, folded flex microelectronic package 160 attached thereto, within a housing or chassis 184. The motherboard 182 may be attached to various peripheral devices including inputs devices, such as a keyboard 186 and/or a mouse 188, and a display device, such as a CRT monitor 190.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic package, comprising:
   a microelectronic die having an active surface and a back surface, said microelectronic die having an integrated circuit layer proximate said microelectronic die active surface and at least one conductive via extending from said microelectronic die back surface to said microelectronic integrated circuit layer; and
   a flexible substrate having a first surface and a second surface, wherein said microelectronic die active surface substantially faces a first portion of said flexible substrate first surface and is electrically connected to said flexible substrate first surface and wherein said microelectronic die back surface substantially faces a second portion of said flexible substrate first surface and at least one conductive via is electrically connected to said flexible substrate first surface.

2. The microelectronic package of claim 1, further comprising at least one external interconnect devices attached to said flexible substrate second surface proximate said microelectronic die active surface.

3. The microelectronic package of claim 1, further comprising at least one first interconnect device extending from said microelectronic die active surface to said flexible substrate first surface.

4. The microelectronic package of claim 1, further comprising at least one second interconnect device extending from said at least one conductive via to said flexible substrate first surface.

5. The microelectronic package of claim 1, further comprising a first underfill material disposed between said microelectronic die active surface and said flexible substrate first surface.

6. The microelectronic package of claim 1, further comprising a second underfill material disposed between said microelectronic die back surface to said flexible substrate first surface.

7. The microelectronic package of claim 1, further including an additional microelectronic die attached to a flexible substrate second surface proximate said microelectronic die back surface.

8. A microelectronic package, comprising:
   a microelectronic die having an active surface and a back surface, said microelectronic die having an integrated circuit layer proximate said microelectronic die active surface and at least one conductive via extending from said microelectronic die back surface to said microelectronic integrated circuit layer;
   a flexible substrate having a first surface and a second surface, wherein said microelectronic die active surface substantially faces a first portion of said flexible substrate first surface and is electrically connected to said flexible substrate first surface and wherein said microelectronic die back surface substantially faces a second portion of said flexible substrate first surface and at least one conductive via is electrically connected to said flexible substrate first surface; and
   a plurality of external contacts extending between a substrate and said flexible substrate second surface.

9. The microelectronic package of claim 8, further comprising at one first interconnect device extending from said microelectronic die active surface to said flexible substrate first surface.

10. The microelectronic package of claim 8, further comprising at least one second interconnect device extending from said conductive via to said flexible substrate first surface.

11. The microelectronic package of claim 8, further comprising a first underfill material disposed between said microelectronic die active surface and said flexible substrate first surface.

12. The microelectronic package of claim 8, further comprising a second underfill material disposed between said microelectronic die back surface and said flexible substrate first surface.

13. The microelectronic package of claim 8, further including an additional microelectronic die attached to a flexible substrate second surface proximate said microelectronic die back surface.

14. A method of fabricating a microelectronic package, comprising:
   providing a microelectronic die having an active surface and a back surface, said microelectronic die having an integrated circuit layer proximate said microelectronic die active surface and at least one conductive via extending from said microelectronic die back surface to said microelectronic integrated circuit layer; and
   providing a flexible substrate having a first surface and a second surface;
   orienting a first portion of said flexible substrate first surface to substantially face said microelectronic die active surface;
   electrically connecting said microelectronic die active surface to said flexible substrate first surface;
   orienting a second portion of said flexible substrate first surface to substantially face said microelectronic die back surface; and
   electrically connecting said at least one conductive via to said flexible substrate first surface.

15. The method of claim 14, further comprising attaching a plurality of external interconnect devices to said flexible substrate second surface proximate said microelectronic die active surface.

16. The method of claim 14, wherein electrically connecting said microelectronic die active surface to said flexible substrate first surface comprises attaching at least one first interconnect device between said microelectronic die active surface and said flexible substrate first surface.

17. The method of claim 14, wherein electrically connecting said at least one conductive via to said flexible substrate first surface comprises attaching at least one second interconnect device between said at least one conductive via die and said flexible substrate first surface.

18. The method of claim 14, further comprising disposing a first underfill material between said microelectronic die active surface and said flexible substrate first surface.

19. The method of claim 14, further comprising disposing a second underfill material between said microelectronic die back surface and said flexible substrate first surface.

20. The method of claim 14, further including attaching an additional microelectronic die to a flexible substrate second surface proximate said microelectronic die back surface.

21. A microelectronic system, comprising:
a substrate within a housing; and
at least one microelectronic package attached to said substrate, including:
- a microelectronic die having an active surface and a back surface, said microelectronic die having an integrated circuit layer proximate said microelectronic die active surface and at least one conductive via extending from said microelectronic die back surface to said microelectronic integrated circuit layer; and
- a flexible substrate having a first surface and a second surface, wherein said microelectronic die active surface substantially faces a first portion of said flexible substrate first surface and is electrically connected to said flexible substrate first surface and wherein said microelectronic die back surface substantially faces a second portion of said flexible substrate first surface and at least one conductive via is electrically connected to said flexible substrate first surface.

22. The system of claim 21, further comprising an input device in electronic communication with said substrate.

23. The system of claim 21, further comprising a display device in electronic communication with said substrate.

* * * * *